(12) United States Patent
Dawes

(10) Patent No.: US 6,333,673 B2
(45) Date of Patent: Dec. 25, 2001

(54) ELECTRONIC CIRCUIT

(75) Inventor: Alan Dawes, Wiltshire (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/739,635

(22) Filed: Dec. 20, 2000

(30) Foreign Application Priority Data

Dec. 22, 1999 (GB) .................................. 9930388

(51) Int. Cl.[7] ....................................... H03F 1/02
(52) U.S. Cl. .............................. 330/9; 330/69; 330/150
(58) Field of Search ............................ 330/9, 69, 150

(56) References Cited

U.S. PATENT DOCUMENTS

| | | | |
|---|---|---|---|
| 4,633,425 | * 12/1986 | Senderowicz | 364/825 |
| 4,667,179 | 5/1987 | Law et al. | |
| 4,833,418 | * 5/1989 | Quintus et al. | 330/9 |
| 4,849,661 | 7/1989 | Bazes | |
| 5,084,639 | * 1/1992 | Ribner | 307/490 |
| 5,166,630 | 11/1992 | Lee | |
| 5,327,092 | 7/1994 | Inogai et al. | |
| 5,563,504 | 10/1996 | Gilbert et al. | |
| 5,565,813 | 10/1996 | Connell et al. | |
| 5,745,002 | * 4/1998 | Baschirotto et al. | 327/554 |
| 5,790,064 | 8/1998 | Fujimori | |
| 5,847,600 | * 12/1998 | Brooks et al. | 330/9 |
| 6,097,248 | * 8/2000 | Segami | 330/9 |

FOREIGN PATENT DOCUMENTS

| | | |
|---|---|---|
| 0689286 A1 | 12/1995 | (EP) . |
| 0743747 A2 | 11/1996 | (EP) . |
| 0743747 A3 | 11/1996 | (EP) . |
| 0822659 A2 | 2/1998 | (EP) . |
| 0836272 A | 4/1998 | (EP) . |
| 2202400 A | 12/1988 | (GB) . |
| 2308684 A | 7/1997 | (GB) . |
| WO 85/01623 | 4/1985 | (WO) . |

OTHER PUBLICATIONS

Singor, F. W. et al., "10.7MHZ Bandpass Delta–Sigma A. D. Modulators", San Diego, May 1–4, 1994, New York, IEEE, US, vol. CONF. 16, May 1, 1994, pp. 163–166.

* cited by examiner

Primary Examiner—Robert Pascal
Assistant Examiner—Henry Choe
(74) Attorney, Agent, or Firm—Burns, Doane, Swecker & Mathis, L.L.P.

(57) ABSTRACT

A switched capacitor anplifier circuit is provided with two independent reference voltages, one which provides an appropriate bias level for the amplifiers, and one which sets a common mode input level for the amplifiers, thereby allowing the dynamic range to be maximized.

3 Claims, 3 Drawing Sheets

ELECTRONIC CIRCUIT

This application claims priority under 35 U.S.C. §§119 and/or 365 to 9930388.5 filed in United Kingdom on Dec. 22, 1999; the entire content of which is hereby incorporated by reference.

TECHNICAL FIELD OF THE INVENTION

This invention relates to an electronic circuit, and in particular to a low voltage differential amplifier incorporating switched capacitors.

BACKGROUND OF THE INVENTION

A standard, fully differential, operational amplifier has specific requirements as regards the bias voltage which must be supplied thereto, in order for it to operate effectively. Specifically, the amplifier usually includes at its input a single pair of differential transistors. If PMOS input devices are used, then, in order to provide suitable bias voltages to these transistors at low supply voltages, the input reference voltage level needs to be nearer to the negative supply voltage than to the positive supply. This restricts the voltage swing which can be handled by the input stage, and hence restricts the maximum available dynamic range at the output of the operational amplifier. Likewise, if NMOS input devices are used, the input reference voltage level needs to be nearer to the positive supply voltage than to the negative supply.

U.S. Pat. No. 5,565,813 discloses a low voltage differential amplifier, in which the voltage on a capacitance circuit, which is switched in and out of the circuit, is used to provide a bias voltage.

SUMMARY OF THE INVENTION

The prior art has the problem discussed above that, at low supply voltages, the maximum available dynamic range at the output of the operational amplifier is restricted.

One possible solution to this problem is to use a voltage boosting circuit such as a charge pump, to provide a supply voltage to the amplifier circuit which is higher than the actual supply voltage level. With a higher amplifier supply voltage, the input reference voltage level can be set close to half way between the negative supply voltage and the positive supply, while still providing suitable bias voltages to the input stage transistors. This maximises the dynamic range of the circuit. However, this solution has the disadvantage that it wastes power to boost the supply voltage in this way.

According to the invention, a switched capacitor circuit provides the bias voltages for a differential amplifier circuit, supplied from two reference voltages. More specifically, a first reference level is used to bias the amplifier input stage, and a second reference level is used to set the centre of the dynamic excursion range of the amplifier output stage. Thus, the first reference level can be set to a level determined by the biassing requirement of the amplifier input The second reference level can be set to one half of the supply voltage.

DETAILED DESCRIPTION OF PREFERRED EMBODIMENTS

Figure 1:
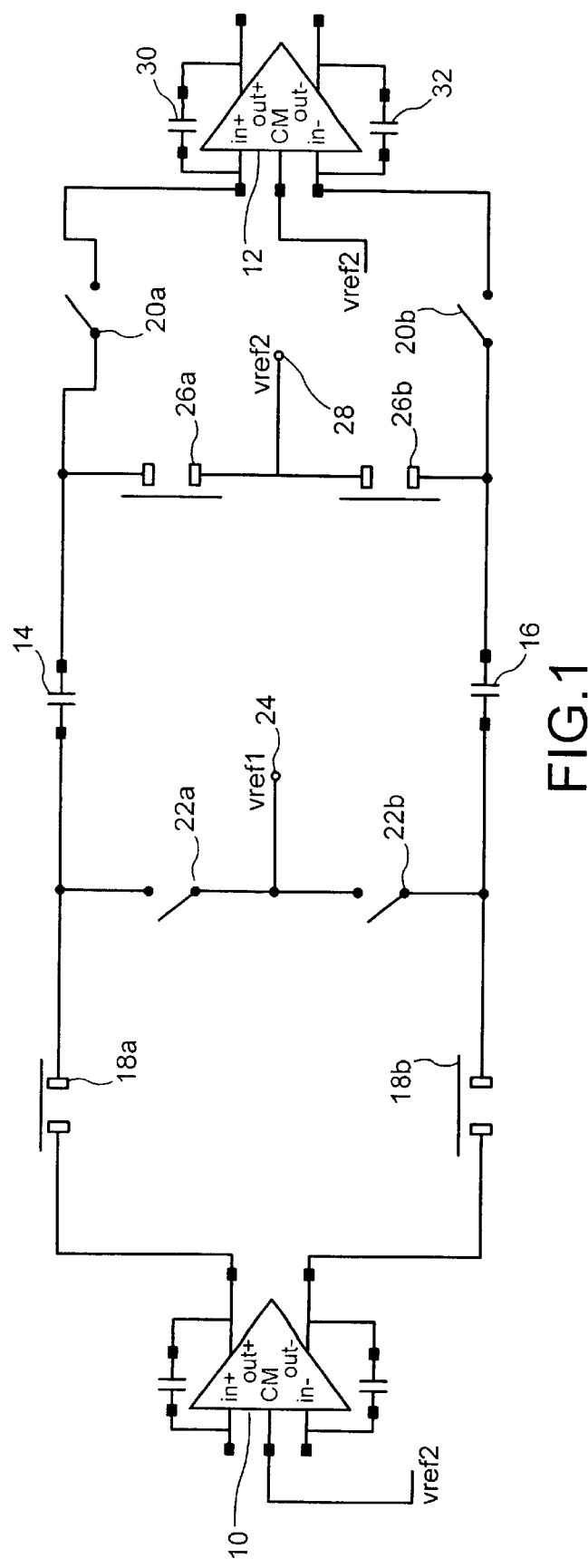
FIG. 1 shows a switched capacitor amplifier circuit according to the invention, in a first phase of operation.

FIG. 1 shows a switched capacitor amplifier circuit, having two operational amplifier circuits 10, 12 cascaded together. That is, each amplifier circuit has a pair of differential input terminals in+, in−, and a pair of differential output terminals out+, out−, and the output terminals out+, out− of the first amplifier circuit 10 are connected to the corresponding input terminals of the subsequent amplifier circuit 12. Any desired number of amplifier circuits can be cascaded in this way. Each amplifier circuit also hag an input pin CM, by means of which the common mode output voltage may be set.

Located between each positive output terminal and the subsequent input terminal is a first capacitor 14, and located between each negative output terminal and the subsequent input terminal is a second capacitor 16. As is conventional in switched capacitor circuits, these capacitors can be connected to either one of the respective output terminal or the respective input terminal, by means of switches. Thus, there is a first pair of switches 18a, 18b, connected respectively between the output terminals out+, out− of the operational amplifier 10 and the respective capacitors 14, 16. Further, there is a second pair of switches 20a, 20b, connected respectively between the respective capacitors 14, 16 and the input terminals in+, in− of the operational amplifier 12.

Moreover, there is a third pair of switches 22a, 22b, connected between the positive and negative rails, from nodes between the respective switch 18a, 18b of the first pair and the respective capacitor 14, 16, with an input terminal 24 between the switches 22a and 22b. Further, there is a fourth pair of switches 26a, 26b, connected between the positive and negative rails, from nodes between the respective capacitor 14, 16 and the respective switch 20a, 20b of the second pair, with an input terminal 28 between the switches 26a and 26b.

To this extent, the circuit of FIG. 1 is conventional. However, an important aspect of the invention is that, whereas a first voltage reference vref1 is applied to the input terminal 24, an independent second voltage reference vref2 is applied to the input terminal 28. Thus, the first and second voltage references can be different. The importance of this will become apparent from the following description of the operation of the circuit.

In a first phase, as shown in FIG. 1, switches 18a, 18b, 26a, 26b are closed, and switches 20a, 20b, 22a, 22b are open. As a result, the capacitors 14, 16 are charged by the output stage of the amplifier 10 to the level of the second voltage reference vref2.

In order to allow the charging of the capacitors 14, 16 to be balanced and symmetrical, the second voltage reference vref2 is made equal to the common mode output voltage of the amplifier, which is itself defined by the voltage on the input pin CM of the amplifier. The second voltage reference vref2 can be set to be VDD/2, where VDD is the supply voltage, to maximise the output dynamic range of the amplifier.

Figure 2:
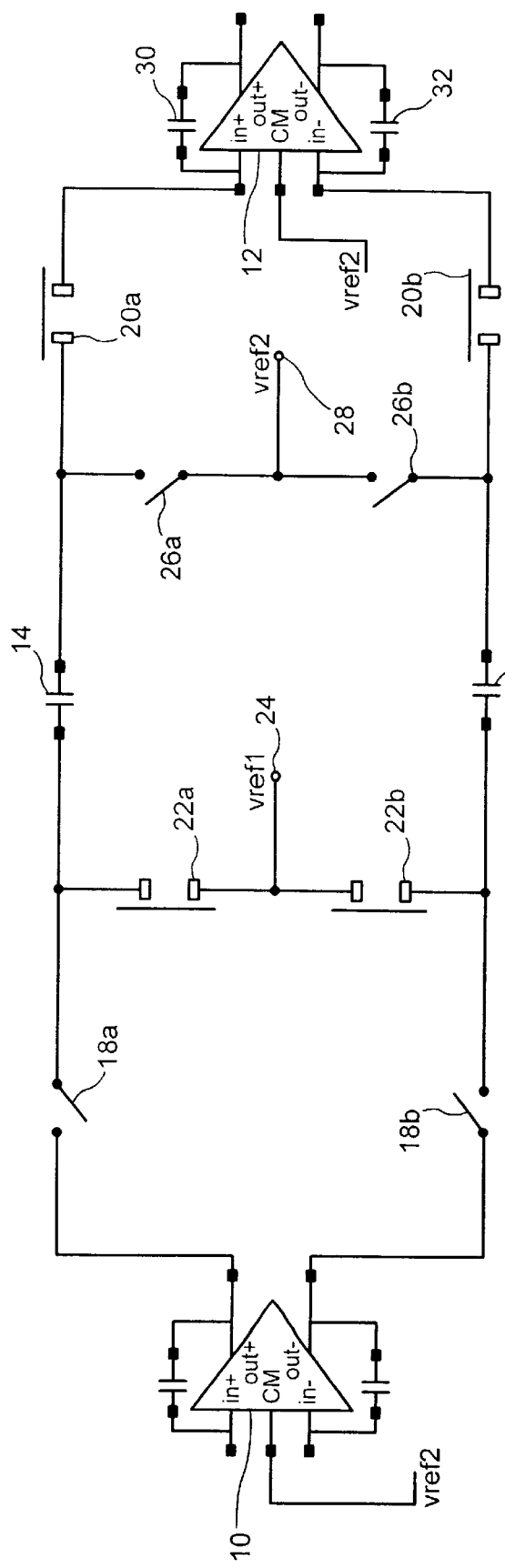
FIG. 2 shows the switched capacitor amplifier circuit of FIG. 1 in a second phase of operation.

In a second phase, as shown in FIG. 2, switches 18a, 1b, 26a, 26b are open, and switches 20a, 20b, 22a, 22b are closed. The voltages on the capacitors 14, 16 then bias the input terminals in+, in− respectively of the subsequent amplifier 12. Because the first voltage reference vref1 is set not to be equal to the second voltage reference vref2, the dynamic range of the input of the amplifier 12 can be maximised, for reasons described below.

Also in the second phase, the capacitors 14, 16 can discharge through integrator output capacitors 30, 32, and hence the voltage levels on the capacitors can shift. Specifically, the capacitors 14, 16 are rereferenced to the level of the first voltage reference vref1.

Figure 3:
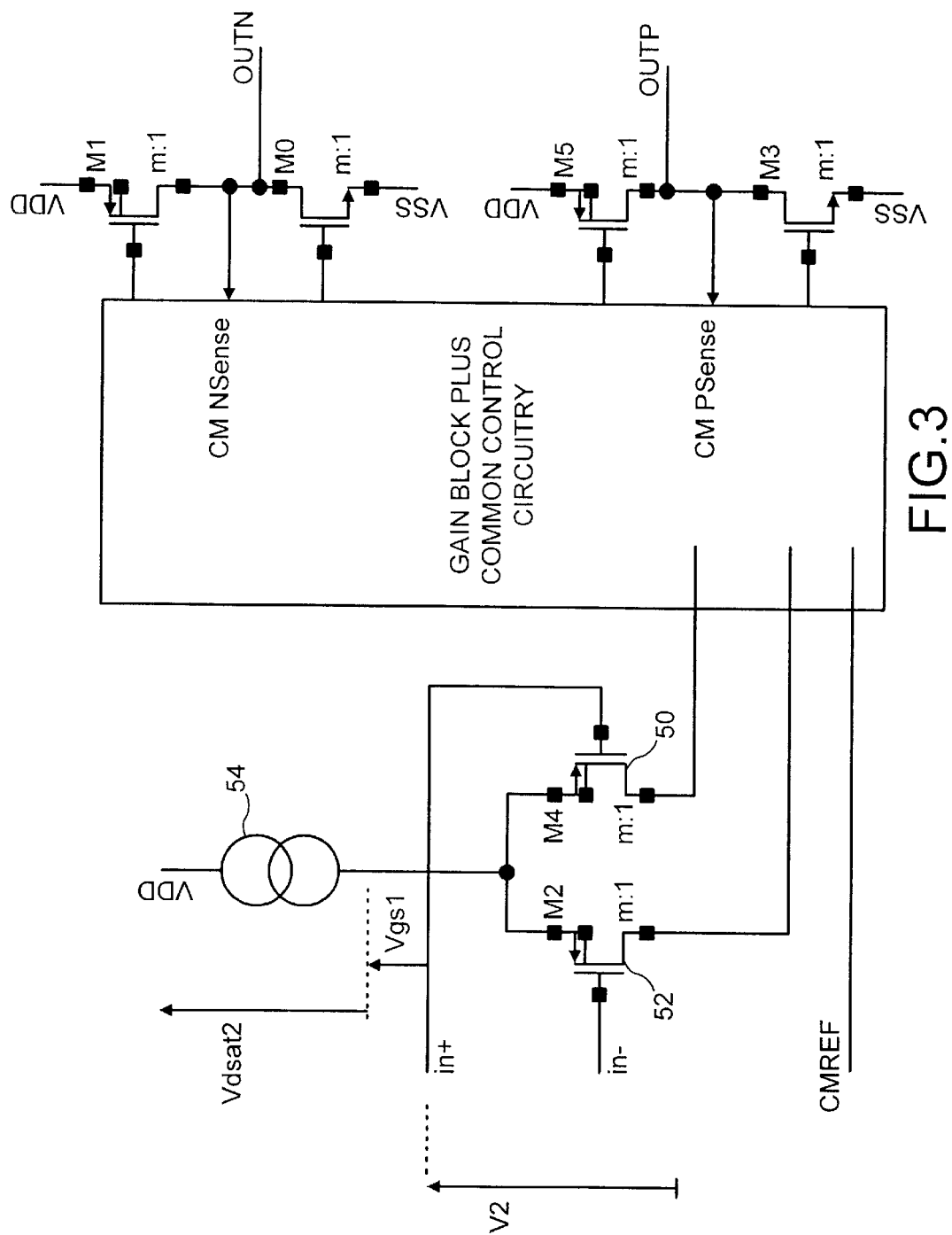
FIG. 3 shows a differential amplifier forming part of the amplifier circuit of the invention.

Thus, this first voltage reference vref1 can be set to a level which provides appropriate biassing for the amplifier. For example, FIG. 3 shows schematically an amplifier with a p-input stage, having first and second p-type transistors 50, 52 connected to respective differential input terminals in+, in−. For an amplifier of this type, the first voltage reference vref1 can be set to:

$$vref1=[VDD-(Vgs1+Vdsat2)],$$

in which:

$$Vgs1=Vth+Vdsat1$$

where Vth is the threshold voltage of an input device, Vdsat1 is the saturation voltage of an input device, and Vdsat2 is the saturation voltage of a current source 54 connected to the input pair.

It will be appreciated that any desired bias voltage level can be applied. The provision of different voltage levels for the two voltage reference allows appropriate biassing of the amplifier input stage, while maintaining the maximum available dynamic range for output signals.

What is claimed is:

1. A switched capacitor amplifier circuit, comprising:
a plurality of cascaded differential amplifiers, each having respective differential input terminals and respective differential output terminals;
a first capacitor connected between the positive output terminal of a preceding amplifier and the positive input terminal of a succeeding-amplifier;
a second capacitor connected between the negative output terminal of the preceding amplifier and the negative input terminal of the succeeding amplifier;
a switching circuit connected to switch the first and second capacitors alternately between a first voltage reference and the input terminals of the succeeding amplifier and between the output terminals of the preceding amplifier and a second voltage reference;
the second voltage reference being independent of the first voltage reference.

2. A switched capacitor amplifier circuit as claimed in claim 1, wherein the first voltage reference is set to a level determined by a biasing requirement of the amplifier circuits.

3. A switched capacitor amplifier circuit as claimed in claim 1, wherein the second voltage reference is set to maximize the output range of the amplifier.

* * * * *